United States Patent
Yu et al.

(10) Patent No.: US 8,759,949 B2
(45) Date of Patent: Jun. 24, 2014

(54) WAFER BACKSIDE STRUCTURES HAVING COPPER PILLARS

(75) Inventors: Chen-Hua Yu, Hsin-Chu (TW);
Hon-Lin Huang, Hsin-Chu (TW);
Kuo-Ching Hsu, Taipei (TW);
Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 416 days.

(21) Appl. No.: 12/708,287

(22) Filed: Feb. 18, 2010

(65) Prior Publication Data

US 2010/0276787 A1 Nov. 4, 2010

Related U.S. Application Data

(60) Provisional application No. 61/174,339, filed on Apr. 30, 2009.

(51) Int. Cl.
*H01L 29/40* (2006.01)
*H01L 23/48* (2006.01)
*H01L 23/52* (2006.01)
*H01L 21/44* (2006.01)

(52) U.S. Cl.
USPC ............ 257/621; 257/737; 257/751; 257/774; 257/E23.011; 257/E23.069; 257/E21.295; 438/614

(58) Field of Classification Search
None
See application file for complete search history.

(56) References Cited

U.S. PATENT DOCUMENTS

| | | | |
|---|---|---|---|
| 3,461,357 A | 8/1969 | Mutter et al. | |
| 4,005,472 A * | 1/1977 | Harris et al. | .................. 257/737 |
| 5,136,364 A | 8/1992 | Byrne | |
| 5,391,917 A | 2/1995 | Gilmour et al. | |
| 5,510,298 A | 4/1996 | Redwine | |
| 5,767,001 A | 6/1998 | Bertagnolli et al. | |
| 5,897,362 A | 4/1999 | Wallace | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,376,332 B1 | 4/2002 | Yanagita et al. | |
| 6,448,168 B1 | 9/2002 | Rao et al. | |

(Continued)

FOREIGN PATENT DOCUMENTS

| | | |
|---|---|---|
| JP | 2000-188357 A | 7/2000 |
| JP | 2001-257310 A | 9/2001 |

(Continued)

OTHER PUBLICATIONS

Shen, L-C, et al., "A Clamped Through Silicon via (TSV) Interconnection for Stacked Chip Bonding Using Metal Cap on Pad and Metal Column Forming in via," 2008, IEEE, pp. 544-549.

*Primary Examiner* — Michael Jung
(74) *Attorney, Agent, or Firm* — Slater and Matsil, L.L.P.

(57) ABSTRACT

An integrated circuit structure includes a semiconductor substrate having a front side and a backside, and a conductive via penetrating the semiconductor substrate. The conductive via includes a back end extending to the backside of the semiconductor substrate. A redistribution line (RDL) is on the backside of the semiconductor substrate and electrically connected to the back end of the conductive via. A passivation layer is over the RDL, with an opening in the passivation layer, wherein a portion of the RDL is exposed through the opening. A copper pillar has a portion in the opening and electrically connected to the RDL.

11 Claims, 11 Drawing Sheets

(56) References Cited

U.S. PATENT DOCUMENTS

| | | |
|---|---|---|
| 6,465,892 B1 | 10/2002 | Suga |
| 6,472,293 B1 | 10/2002 | Suga |
| 6,538,333 B2 | 3/2003 | Kong |
| 6,566,239 B2 | 5/2003 | Makino et al. |
| 6,599,778 B2 | 7/2003 | Pogge et al. |
| 6,630,736 B1 | 10/2003 | Ignaut |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,765,299 B2 | 7/2004 | Takahashi et al. |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,897,125 B2 | 5/2005 | Morrow et al. |
| 6,924,551 B2 | 8/2005 | Rumer et al. |
| 6,936,923 B2 | 8/2005 | Lin et al. |
| 6,958,546 B2 | 10/2005 | Fan et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,095,116 B1 | 8/2006 | Kelkar et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,271,483 B2 | 9/2007 | Lin et al. |
| 7,291,542 B2 | 11/2007 | Iwamatsu et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,355,279 B2 | 4/2008 | Ke et al. |
| 7,371,663 B2 | 5/2008 | Chen et al. |
| 7,378,732 B2 | 5/2008 | Yamano et al. |
| 7,417,326 B2 | 8/2008 | Ikumo et al. |
| 7,465,653 B2 | 12/2008 | Huang et al. |
| 7,524,753 B2 | 4/2009 | Sunohara et al. |
| 7,569,935 B1 | 8/2009 | Fan |
| 7,713,861 B2 | 5/2010 | Yu |
| 7,786,584 B2 | 8/2010 | Barth et al. |
| 7,804,177 B2 | 9/2010 | Lu et al. |
| 7,838,337 B2 | 11/2010 | Marimuthu et al. |
| 7,863,739 B2 | 1/2011 | Lee et al. |
| 7,863,740 B2 | 1/2011 | Ke et al. |
| 7,902,679 B2 | 3/2011 | Lin et al. |
| 7,928,534 B2 * | 4/2011 | Hsu et al. ............ 257/621 |
| 7,936,075 B2 | 5/2011 | Eda |
| 7,956,442 B2 * | 6/2011 | Hsu et al. ............ 257/621 |
| 7,977,771 B2 | 7/2011 | Higuchi |
| 8,022,543 B2 | 9/2011 | Farooq et al. |
| 8,097,964 B2 | 1/2012 | West et al. |
| 8,158,489 B2 | 4/2012 | Huang et al. |
| 8,264,077 B2 | 9/2012 | Chiou et al. |
| 8,288,872 B2 | 10/2012 | Chen et al. |
| 8,420,522 B2 | 4/2013 | Ikumo et al. |
| 2002/0121692 A1 | 9/2002 | Lee et al. |
| 2004/0151917 A1 | 8/2004 | Chen et al. |
| 2005/0176235 A1 * | 8/2005 | Noma et al. ............ 438/614 |
| 2005/0212133 A1 | 9/2005 | Barnak et al. |
| 2005/0236693 A1 | 10/2005 | Kroninger et al. |
| 2006/0014320 A1 * | 1/2006 | Yamano et al. ............ 438/113 |
| 2006/0046431 A1 | 3/2006 | Blietz et al. |
| 2006/0099791 A1 | 5/2006 | Mitani et al. |
| 2007/0102815 A1 | 5/2007 | Kaufmann et al. |
| 2007/0210259 A1 | 9/2007 | Kerwin et al. |
| 2008/0023850 A1 | 1/2008 | Lu et al. |
| 2008/0035854 A1 | 2/2008 | Jin et al. |
| 2008/0054459 A1 | 3/2008 | Lee et al. |
| 2008/0057678 A1 | 3/2008 | Gadkaree et al. |
| 2008/0079121 A1 | 4/2008 | Han |
| 2008/0083985 A1 | 4/2008 | Lee et al. |
| 2008/0131679 A1 | 6/2008 | Nakai et al. |
| 2008/0258299 A1 * | 10/2008 | Kang et al. ............ 257/737 |
| 2009/0098724 A1 | 4/2009 | Yu |
| 2009/0102021 A1 * | 4/2009 | Chen et al. ............ 257/621 |
| 2009/0140381 A1 | 6/2009 | Lin et al. |
| 2009/0267213 A1 | 10/2009 | Lin et al. |
| 2010/0009318 A1 | 1/2010 | Kim |
| 2010/0013102 A1 | 1/2010 | Tay et al. |
| 2010/0022034 A1 | 1/2010 | Antol et al. |
| 2010/0090318 A1 | 4/2010 | Hsu et al. |
| 2010/0090319 A1 | 4/2010 | Hsu et al. |
| 2010/0224966 A1 | 9/2010 | Chen |
| 2010/0244241 A1 | 9/2010 | Marimuthu et al. |
| 2010/0252934 A1 | 10/2010 | Law et al. |
| 2010/0320575 A9 * | 12/2010 | Chauhan ............ 257/621 |
| 2010/0330798 A1 | 12/2010 | Huang et al. |
| 2011/0049706 A1 | 3/2011 | Huang et al. |
| 2011/0165776 A1 | 7/2011 | Hsu et al. |
| 2011/0186990 A1 | 8/2011 | Mawatari et al. |
| 2011/0193235 A1 | 8/2011 | Hu et al. |
| 2011/0233785 A1 | 9/2011 | Koester et al. |
| 2011/0248404 A1 | 10/2011 | Chiu et al. |
| 2011/0291259 A9 | 12/2011 | Huang et al. |

FOREIGN PATENT DOCUMENTS

| | | |
|---|---|---|
| JP | 2002-190550 A | 7/2002 |
| JP | 2004-319707 A | 11/2004 |
| JP | 2006-351968 A | 12/2006 |
| JP | 2007-067211 A | 3/2007 |
| JP | 2008-258445 A | 10/2008 |

* cited by examiner

WAFER BACKSIDE STRUCTURES HAVING COPPER PILLARS

CROSS-REFERENCE TO RELATED APPLICATIONS

This application claims the benefit of the following provisionally filed U.S. patent application: Application Ser. No. 61/174,339, filed Apr. 30, 2009, and entitled "Wafer Backside Structures Having Copper Pillars," which application is hereby incorporated herein by reference.

This application is related to following commonly-assigned U.S. patent Applications: application Ser. No. 12/332,934, filed Dec. 11, 2008, and entitled "Backside Connection to TSVs Having Redistribution Lines," and application Ser. No. 12/347,742, filed Dec. 31, 2008, and entitled "Bond Pad Connection to Redistribution Lines Having Tapered Profiles," which applications are hereby incorporated herein by reference.

TECHNICAL FIELD

This invention relates generally to integrated circuit structures, and more particularly to through-silicon vias, and even more particularly to the formation of bond pads connected to the through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuit (3DIC) and stacked dies are commonly used. Through-silicon vias (TSVs) are thus used in 3DIC and stacked dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

FIG. 1 illustrates a conventional TSV 102 formed in chip 104. TSV 102 is in silicon substrate 106. Through the interconnections (metal lines and vias, not shown) in the metallization layers, TSV 102 is electrically connected to bond pad 108, which is on the front surface of chip 104. TSV 102 is exposed through the back surface of silicon substrate 106 in the form of a copper post. When chip 104 is bonded to another chip, TSV 102 is bonded to a bond pad on the other chip, with or without solder therebetween.

The conventional backside TSV connection suffers from drawbacks. Since the TSV bonding requires relatively large pitch between TSVs, the locations of the TSVs are restricted and the distance between the TSVs needs to be big enough to allow room for, for example, solder balls. New backside structures are thus needed.

SUMMARY OF THE INVENTION

In accordance with one aspect of the present invention, an integrated circuit structure includes a semiconductor substrate having a front side and a backside, and a conductive via penetrating the semiconductor substrate. The conductive via includes a back end extending to the backside of the semiconductor substrate. A redistribution line (RDL) is on the backside of the semiconductor substrate and electrically connected to the back end of the conductive via. A passivation layer is over the RDL, with an opening in the passivation layer, wherein a portion of the RDL is exposed through the opening. A copper pillar has a portion in the opening and is electrically connected to the RDL.

Other embodiments are also disclosed.

The advantageous features of the present invention include improved bondability and increased standoff between stacked dies.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel backside connection structure connecting to through-silicon vias (TSVs) and the method of forming the same are provided. The intermediate stages in the manufacturing of an embodiment of the present invention are illustrated. The variations of the embodiments are discussed. Throughout the various views and illustrative embodiments of the present invention, like reference numbers are used to designate like elements.

Figure 1:
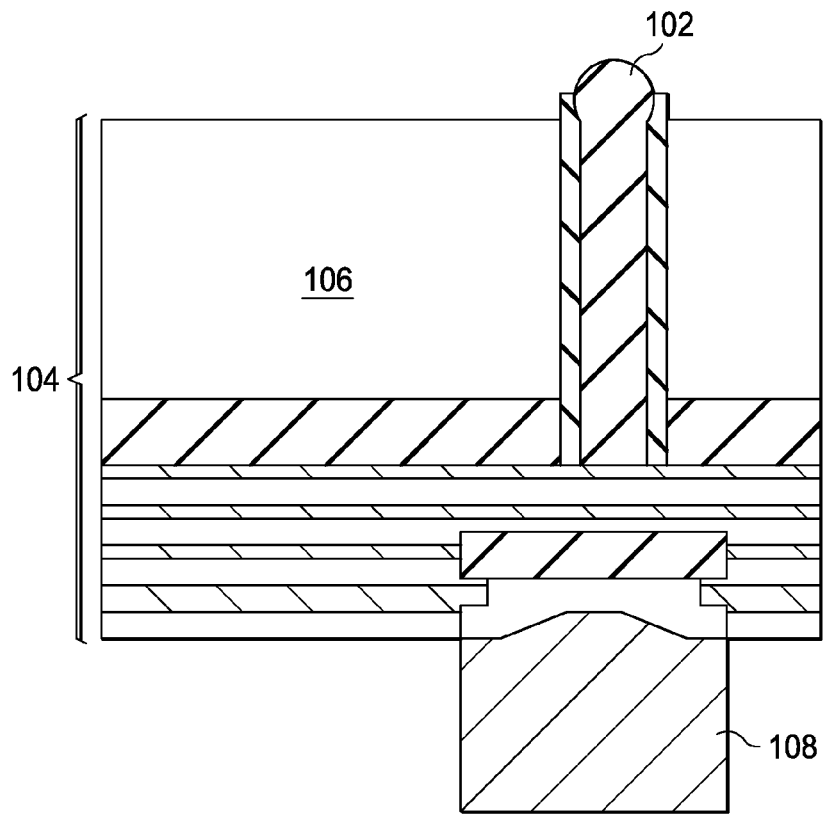
FIG. 1 illustrates a conventional integrated circuit structure including a through-silicon via (TSV), wherein the TSV protrudes through the backside of a substrate, and is bonded to a bond pad on another chip in the form of a copper post.
Figure 2:
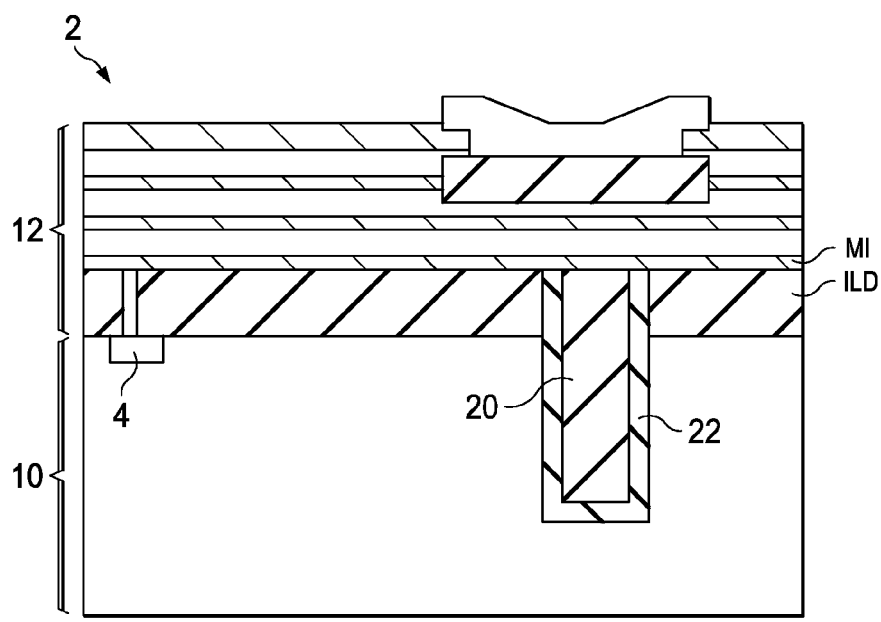
FIGS. 2 through 11 are top views and cross-sectional views of intermediate stages in the manufacturing of an interconnect structure in accordance with an embodiment.

Referring to FIG. 2, chip 2, which includes substrate 10 and integrated circuits (symbolized by block 4) therein, is provided. In an embodiment, chip 2 is a portion of wafer including a plurality of chips identical to chip 2. Substrate 10 may be a semiconductor substrate, such as a bulk silicon substrate, although it may include other semiconductor materials such as group III, group IV, and/or group V elements. Semiconductor devices such as transistors (also illustrated by block 4) may be formed at the front surface (the surface facing up in FIG. 2) of substrate 10. Interconnect structure 12, which includes metal lines and vias (not shown) formed therein, is formed over substrate 10 and connected to the semiconductor devices. The metal lines and vias may be formed of copper or copper alloys, and may be formed using the well-known damascene processes. Interconnect structure 12 may include commonly known inter-layer dielectric (ILD) and inter-metal dielectrics (IMDs).

TSV 20 is formed in substrate 10, and extends from the back surface (the surface facing down in FIG. 2) to the front surface (the surface with active circuits formed thereon). In a first embodiment, as shown in FIG. 2, TSV 20 is formed using a via-first approach, and is formed before the formation of a bottom metallization layer (commonly known as M1). Accordingly, TSV 20 only extends into the ILD that is used to cover the active devices, but not into the IMD layers in interconnect structure 12. In alternative embodiments, TSV 20 is formed using a via-last approach, and is formed after the formation of interconnect structure 12. Accordingly, TSV 20 penetrates through both substrate 10 and interconnect structure 12. Isolation layer 22 is formed on the sidewalls of TSV 20, and electrically insulates TSV 20 from substrate 10. Isolation layer 22 may be formed of commonly used dielectric materials such as silicon nitride, silicon oxide (for example, tetra-ethyl-ortho-silicate (TEOS) oxide), and the like.

Figure 3:
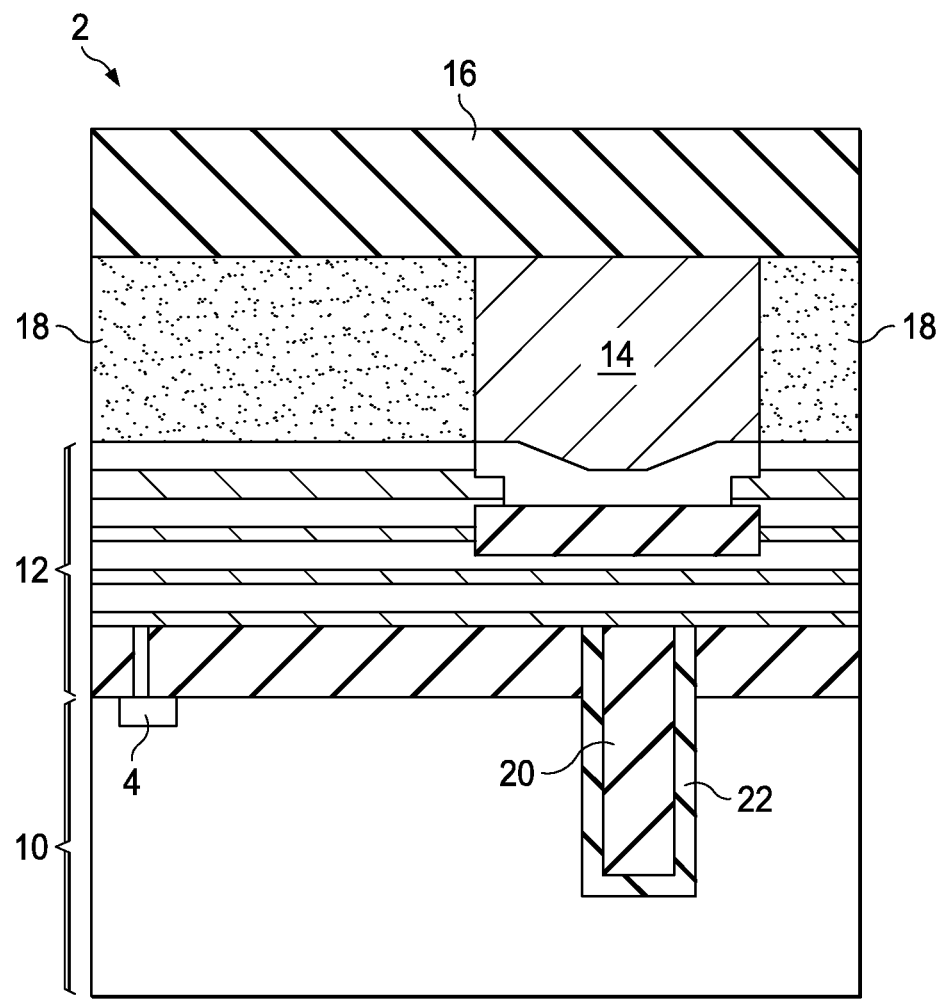
Figure 4:
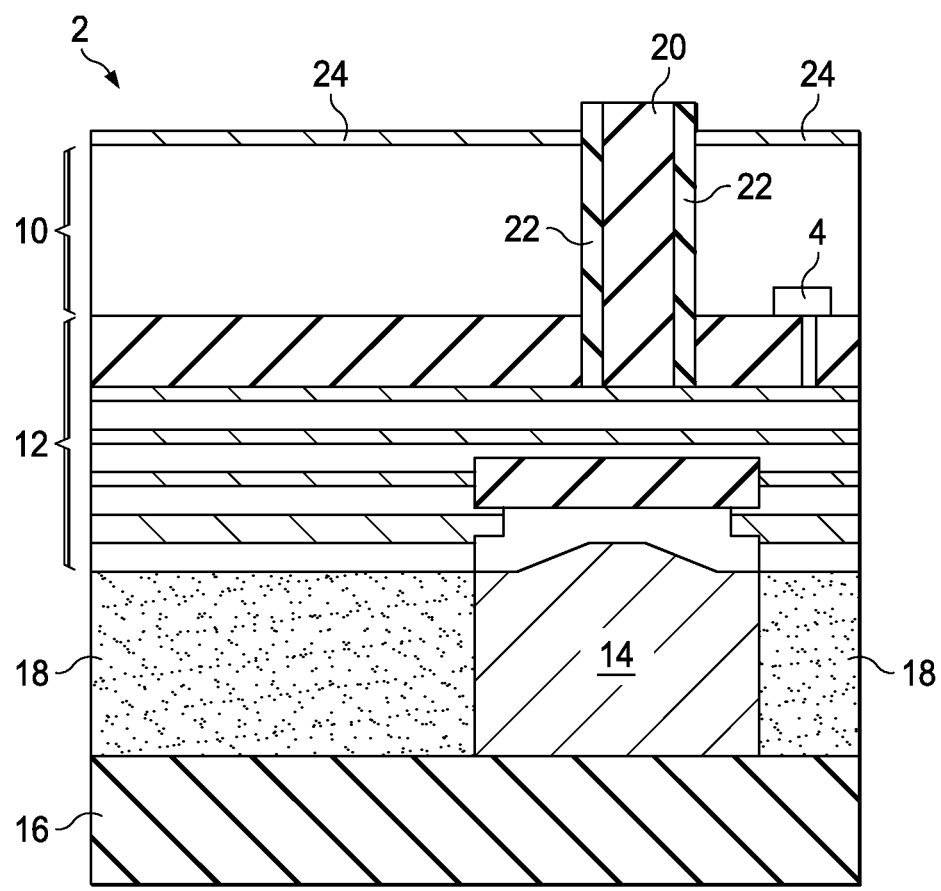

Referring to FIG. 3, bond pad 14 is formed on the front side (the side facing up in FIG. 3) of, and protrudes beyond, the front surface of chip 2. Chip 2 (and the corresponding wafer) is then mounted on carrier wafer 16 through glue 18. In FIG. 4, a backside grinding is performed to remove excess portion of substrate 10. A chemical mechanical polish (CMP) is performed to the backside of chip 2, so that TSV 20 is exposed. Backside isolation layer 24 is formed to cover the backside of substrate 10. In an exemplary embodiment, the formation of backside isolation layer 24 includes etching back the back surface of substrate 10, blanket forming backside isolation layer 24, and performing a light chemical mechanical polish (CMP) to remove the portion of backside isolation layer 24 directly over TSV 20. Accordingly, TSV 20 is exposed through an opening in backside isolation layer 24. In alternative embodiments, the opening in backside isolation layer 24, through which TSV 20 is exposed, is formed by etching.

Figure 5:
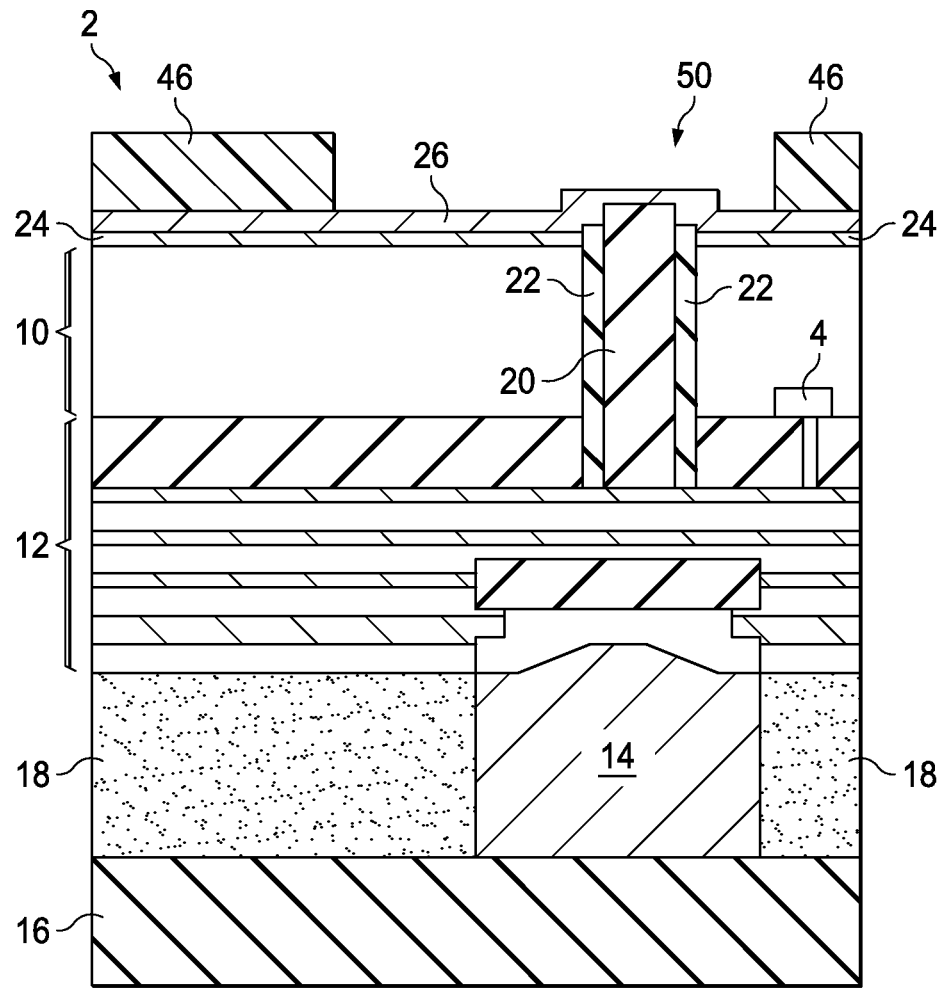

Referring to FIG. 5, thin seed layer 26, also referred to as an under-bump metallurgy (UBM), is blanket formed on backside isolation layer 24 and TSV 20. The usable materials of UBM 26 include copper or copper alloys. However, other metals, such as silver, gold, aluminum, and combinations thereof, may also be included. In an embodiment, UBM 26 is formed using sputtering. In other embodiments, electro plating may be used.

FIG. 5 also illustrates the formation of mask 46. In an embodiment, mask 46 is a photoresist. Alternatively, mask 46 is formed of dry film, which may include an organic material such as Ajinomoto buildup film (ABF). Mask 46 is then patterned to form opening 50 in mask 46, with TSV 20 being exposed through opening 50.

Figure 6:
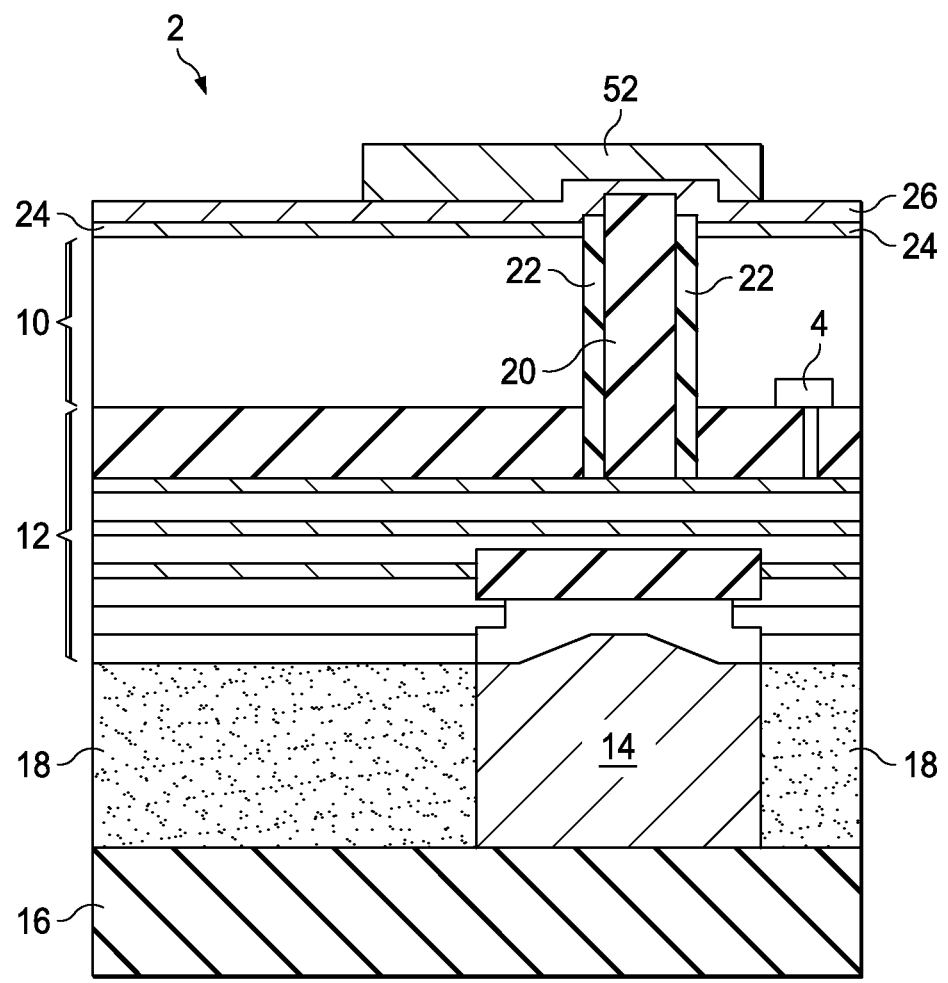

In FIG. 6, opening 50 is selectively filled with a metallic material, forming redistribution line (RDL) 52 in opening 50. In the preferred embodiment, the filling material includes copper or copper alloys, although other metals, such as aluminum, silver, gold, or combinations thereof, may also be used. The formation methods may include electro-chemical plating (ECP), electroless plating, or other commonly used deposition methods such as sputtering, printing, and chemical vapor deposition (CVD) methods. Mask 46 is then removed. As a result, the portions of UBM 26 underlying mask 46 are exposed.

Figure 7:
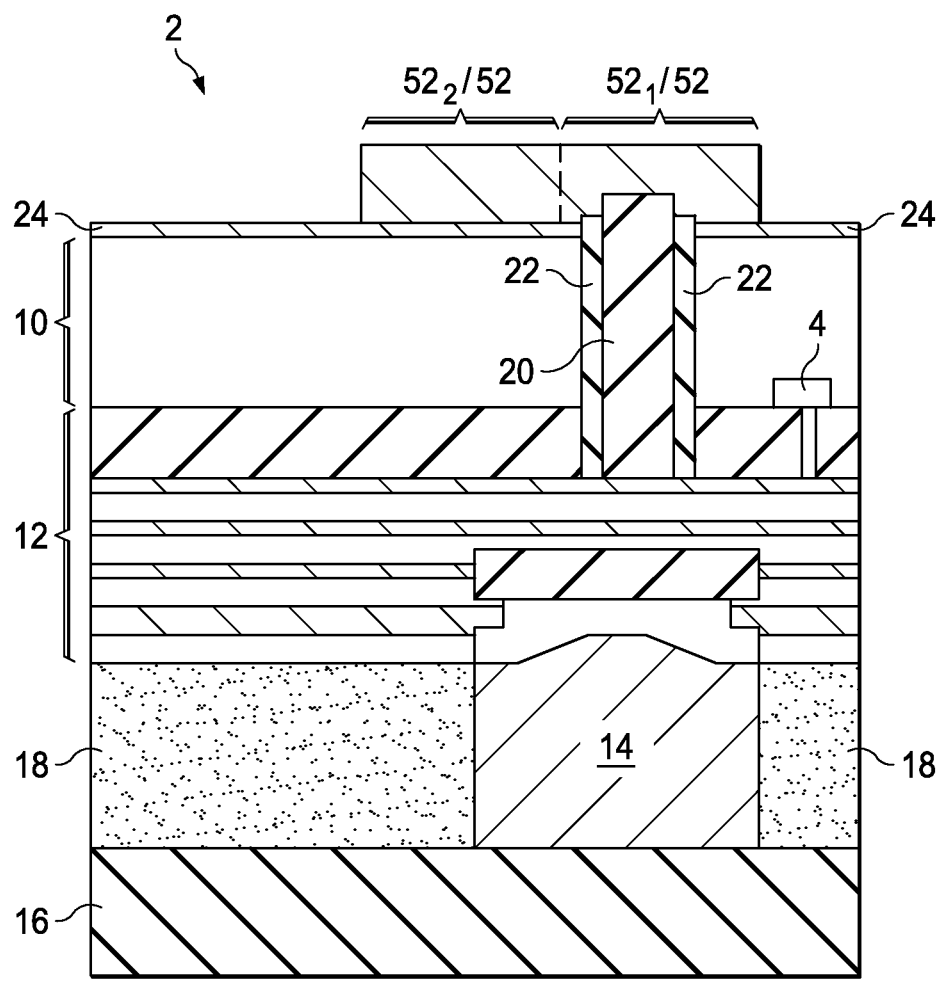

Referring to FIG. 7, the exposed portions of UBM 26 are removed by a flash etching. The remaining RDL 52 may include RDL strip (also referred to as a redistribution trace) $52_1$ that includes a portion directly over, and connected to, TSV 20, and optionally RDL pad $52_2$ joining RDL strip $52_1$. A top view of RDL 52 may be found in FIG. 9. In FIG. 7 and subsequent figures, UBM 26 is not shown since it is typically formed of similar materials as RDL 52, and thus it appears to be merged with RDL 52. As a result of the flash etching, a thin layer of RDL 52 is also removed. However, the removed portion of RDL 52 is negligible compared to its overall thickness.

Figure 8:
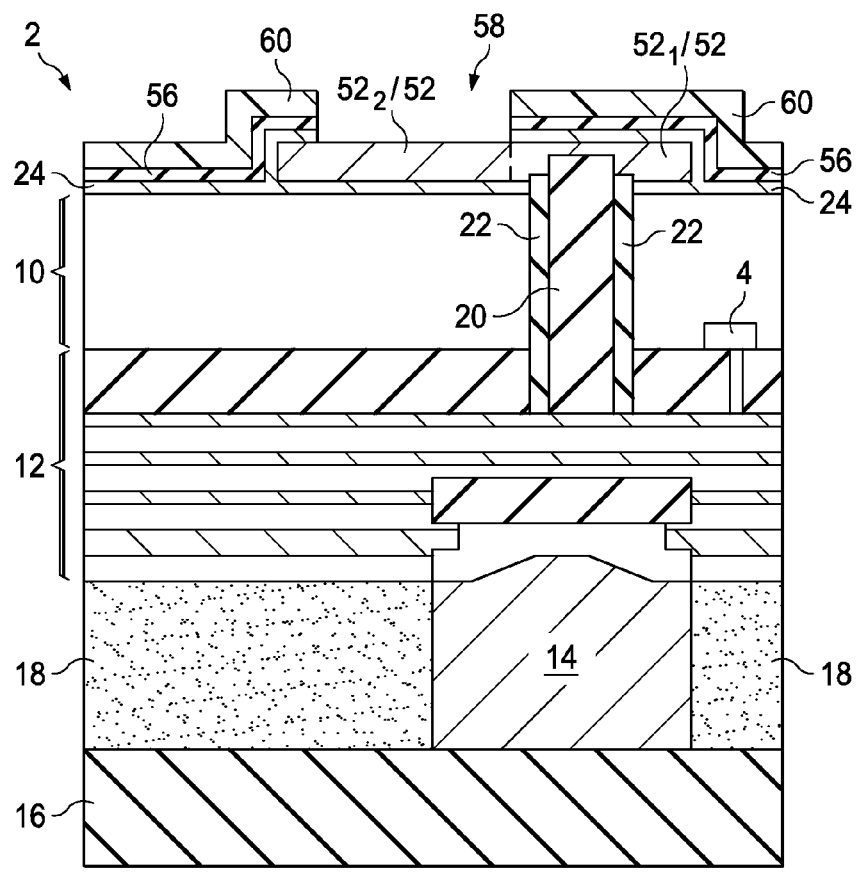

Next, as shown in FIG. 8, passivation layer 56 is blanket formed and patterned to form opening 58. Passivation layer 56 may be formed of nitrides, oxides, polyimide, and the like. Photo resist 60 is applied and developed to define the pattern of opening 58. A portion of RDL pad $52_2$ is exposed through opening 58 in passivation layer 56. Opening 58 may occupy a center portion of RDL pad $52_2$ (please refer to FIG. 9). RDL strip portion $52_1$ may remain to be covered by passivation layer 56.

Figure 9:
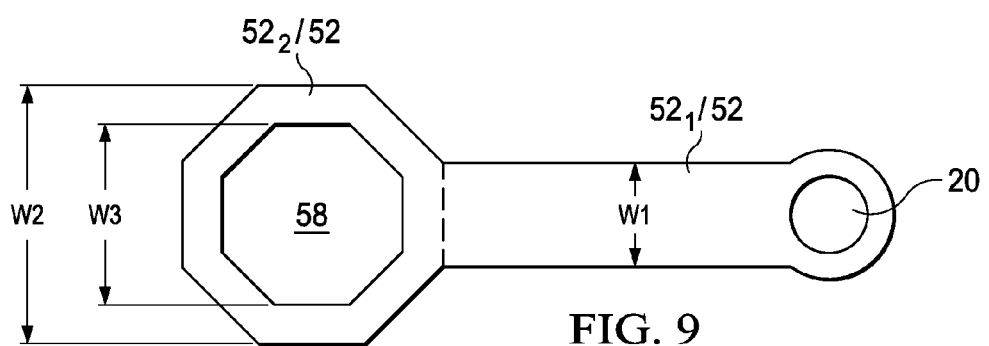

FIG. 9 illustrates a schematic top view of passivation opening 58 and RDL 52. Please note that the dimensions of the illustrated features are not in scale. Preferably, opening 58 has a size smaller than, and exposes a center portion of, RDL pad $52_2$. In an exemplary embodiment, RDL strip $52_1$ has a width W1 between about 5 µm and about 15 µm. RDL pad $52_2$ has a width W2 of about 80 µm to about 100 µm, while passivation opening 58 has a width W3 of about 70 µm to about 90 µm. The top view of passivation opening 58 may have the shape of any polygon including, but not limited to, octagon, hexagon, square, or any other applicable shape.

Figure 10:
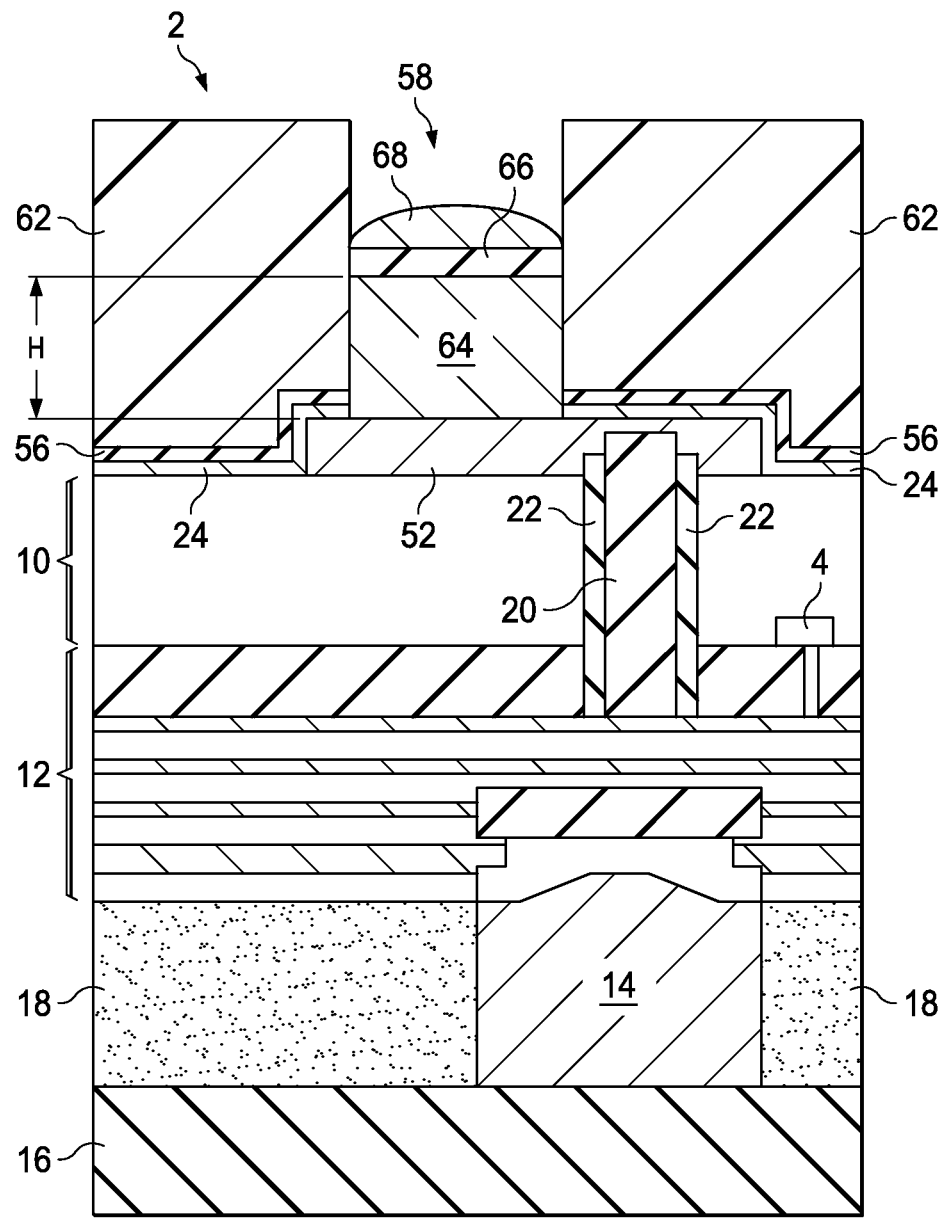

Next, as shown in FIG. 10, photo resist 60 is removed, and photo resist 62 is formed. Photo resist 62 is preferably thicker than photo resist 60. In an embodiment, the thickness of photo resist 62 is greater than about 20 µm, or even greater than about 60 µm. Photo resist 62 is patterned to form an opening (also denoted as 58), through which RDL pad $52_2$ is exposed. Next, copper pillar 64 is formed starting from opening 58 by electro plating. Copper pillar 64 may comprise copper and/or other metals such as silver, gold, tungsten, aluminum, and combinations thereof.

It is observed that in the etching of passivation layer 56 (FIG. 8), polymer may be generated, and the residue polymer in opening 58 may affect the formation of any nickel layer in opening 58. Further, any metal feature formed in opening 58 may be electrically connected to the circuit in chip 2. If electroless plating is used to form a metal feature in opening 58, there may be a possibility that the voltage potential of the circuit portions connected to the metal feature in opening 58 is affected. In embodiments of the present invention, however, electro plating is used in the formation of copper pillar 64 to solve these problems.

With the electro plating, copper pillar 64 may be reliably formed, and will have good quality. Also, the deposition rate of electro plating is high. Accordingly, copper pillar 64 may be deposited to a thickness significantly greater than the metal features deposited using electroless plating. In an exemplary embodiment, the height H of copper pillar 64 is greater than about 15 µm, or even greater than about 60 µm. Next, barrier layer 66 is formed, for example, by electroless plating, wherein barrier layer 66 may be formed of nickel. Alternatively, barrier layer 66 may comprise vanadium (V), chromium (Cr), and combinations thereof. Solder 68 may also be formed on top of barrier layer 66, and may also be formed using electro plating. In an embodiment, solder 68 includes a eutectic solder material formed of tin-lead (Sn—Pb) alloy. In alternative embodiments, solder 68 is formed of a lead-free solder material such as Sn—Ag or Sn—Ag—Cu alloy. It is noted that barrier layer 66 and solder 68 have sidewalls substantially aligned to the sidewalls of copper pillar 64. Further, barrier layer 66 and solder 68 are limited to the region directly over copper pillar 64.

Figure 11:
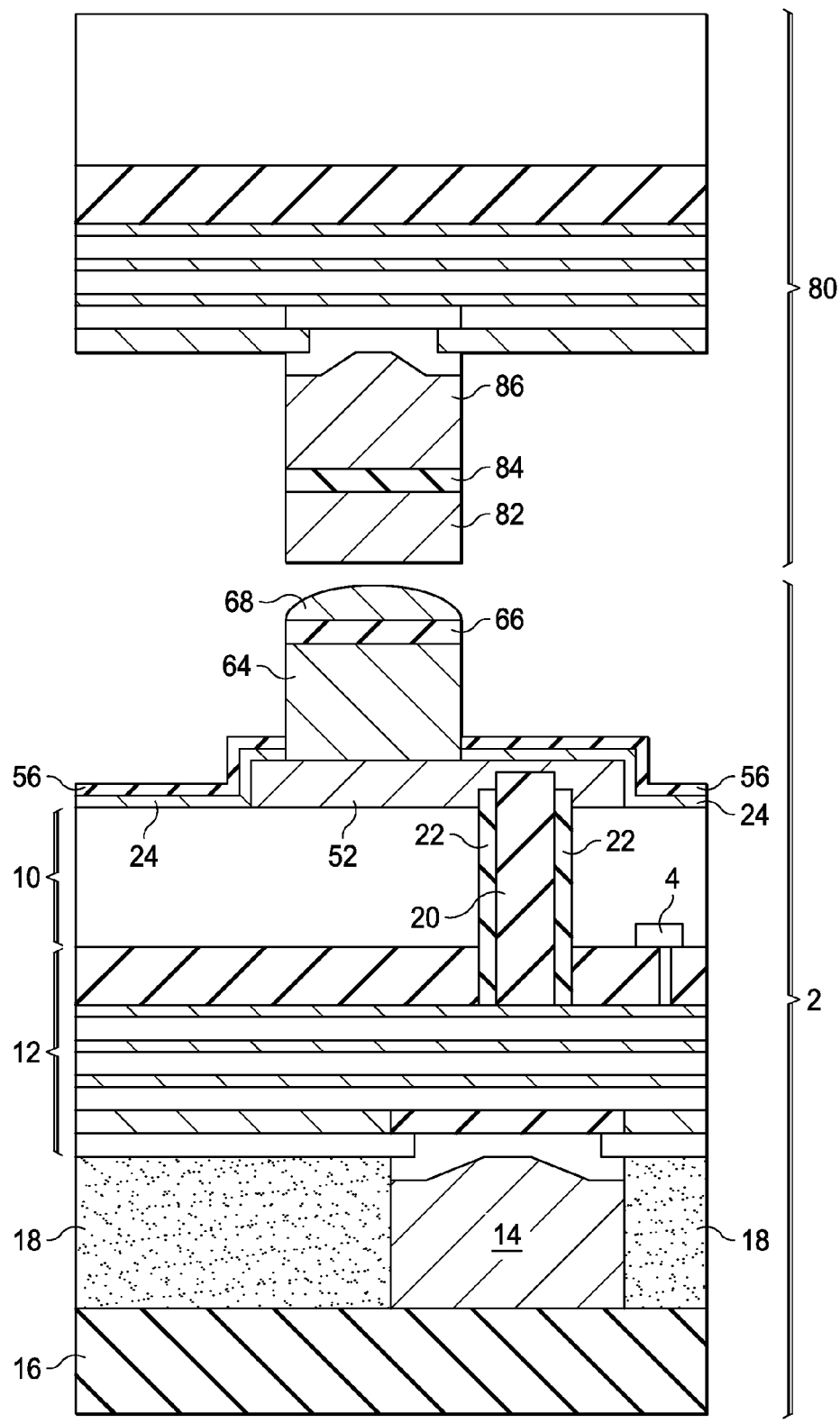

Referring to FIG. 11, photo resist 62 is removed, and the structure as shown in FIG. 10 may be bonded to another chip such as chip 80. In an exemplary embodiment, chip 80 has copper post 86, barrier layer 84, and solder 82 on its front surface, wherein solders 82 and 68 may be reflowed to join each other.

Figure 12:
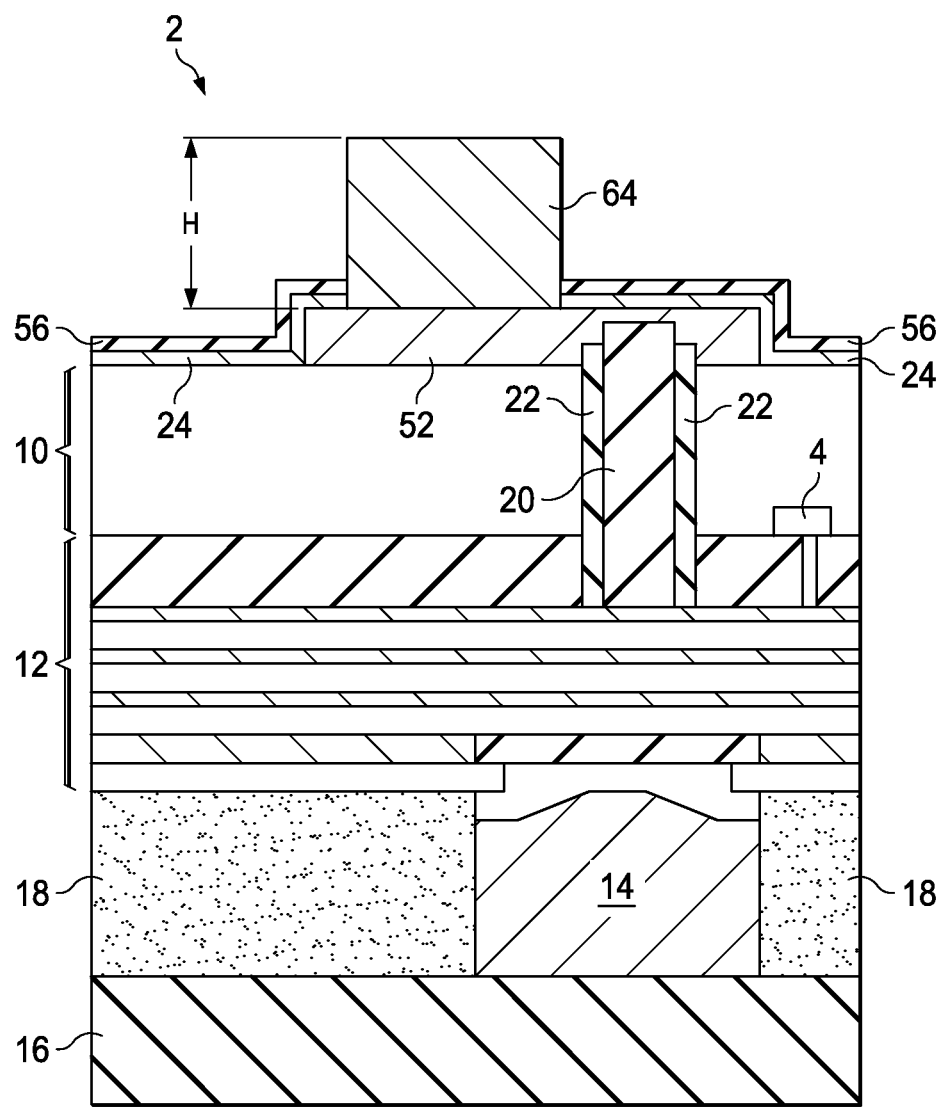
FIGS. 12 and 13 are top views and cross-sectional views of intermediate stages in the manufacturing of an interconnect structure in accordance with another embodiment.
Figure 13:
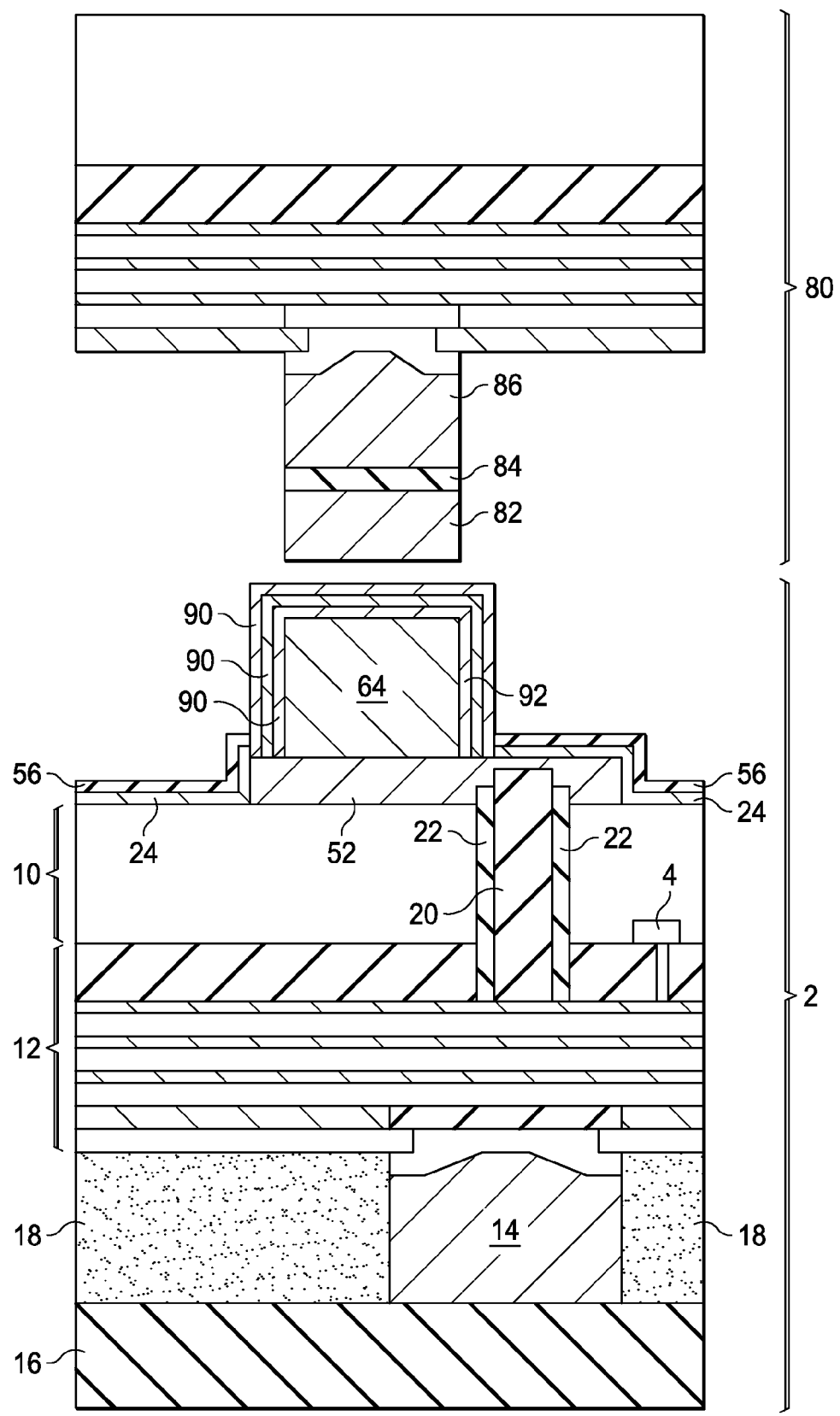

FIGS. 12 and 13 illustrate an alternative embodiment. The initial steps of this embodiment may be essentially the same as illustrated in FIGS. 2 through 9. Next, referring to FIG. 12, after the formation of copper pillar 64 and without forming barrier layer 66, photo resist 62 is removed. Next, as shown in FIG. 13, metal finish 90 is formed. The formation methods of metal finish 90 include ECP, electroless plating, and the like. In an embodiment, metal finish 90 includes nickel layer 92 directly on, and contacting, copper pillar 64. Further, metal finish 90 covers the top of copper pillar 64 and is on sidewalls of copper pillar 64. Optionally, additional layers may be formed, so that metal finish may be an electroless nickel immersion gold (ENIG), a nickel electroless palladium immersion gold (ENEPIG), or a nick palladium layer. Metal finish 90 may also be joined to solder 82 in chip 80.

The embodiments of the present invention have several advantageous features. By forming copper pillar 64 using electro-plating instead of using electroless plating, the deposition rate is much higher, and hence the height of copper pillar 64 may reach tens of microns in a reasonably short time. The standoff between chips 2 and 80 (refer to FIGS. 11 and 13) may thus be increased, so that in the subsequent packaging process, underfill may easily flow into the space between chips 2 and 80.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
a semiconductor substrate comprising a front side and a backside;
a transistor at the front side of the semiconductor substrate;
a conductive via penetrating the semiconductor substrate, the conductive via comprising a back end extending to the backside of the semiconductor substrate;
a redistribution line (RDL) on the backside of the semiconductor substrate and electrically connected to the back end of the conductive via, wherein the RDL is closer to the backside of the semiconductor substrate than to the front side of the semiconductor substrate;
a passivation layer over the RDL, with an opening in the passivation layer, wherein a portion of the RDL is exposed through the opening;
a copper pillar having a portion in the opening and electrically connected to the RDL; and
a metal finish comprising a metal selected from the group consisting essentially of nickel, gold, palladium, and combinations thereof, wherein the metal finish comprises a top portion over the copper pillar and sidewall portions on sidewalls of the copper pillar.

2. The integrated circuit structure of claim 1, wherein the RDL comprises:
an RDL strip comprising a portion directly over, and contacting, the conductive via; and
an RDL pad having a greater width than the RDL strip, wherein the copper pillar comprises a bottom surface contacting a top surface of the RDL pad.

3. The integrated circuit structure of claim 1, wherein the copper pillar has a height greater than about 15 μm.

4. The integrated circuit structure of claim 1, wherein the copper pillar comprises a top surface higher than a top surface of the passivation layer.

5. The integrated circuit structure of claim 1, wherein the conductive via extends from the backside of the semiconductor substrate to the front side of the semiconductor substrate.

6. An integrated circuit structure comprising:
a semiconductor substrate comprising a front side and a backside;
a transistor at the front side of the semiconductor substrate;
a conductive via extending from the backside of the semiconductor substrate into the semiconductor substrate, wherein a back end of the conductive via is exposed through the backside of the semiconductor substrate;
a redistribution line (RDL) over the backside of the semiconductor substrate and connected to the back end of the conductive via, wherein the RDL is closer to the backside of the semiconductor substrate than to the front side of the semiconductor substrate, the RDL comprising:
an RDL strip contacting the conductive via; and
an RDL pad having a greater width than the RDL strip, wherein the RDL pad joins the RDL strip;
a passivation layer over the RDL;
an opening in the passivation layer, wherein a middle portion of the RDL pad is exposed through the opening, and wherein edge portions of the RDL pad are covered by the passivation layer;
a copper pillar in the opening and contacting the middle portion of the RDL pad;
a barrier layer over and contacting the copper pillar; and
a solder layer directly over the barrier layer, wherein the solder layer and the barrier layer are limited to a region directly over the copper pillar.

7. The integrated circuit structure of claim 6, wherein the copper pillar has a thickness greater than about 15 μm.

8. A method of forming an integrated circuit structure, the method comprising:
providing a semiconductor substrate comprising a front side and a backside;

providing a conductive via penetrating the semiconductor substrate, the conductive via comprising a back end extending to the backside of the semiconductor substrate;

forming a redistribution line (RDL) on the backside of the semiconductor substrate and connected to the back end of the conductive via;

forming a passivation layer over the RDL;

forming an opening in the passivation layer, with a portion of the RDL being exposed through the opening;

forming a photo resist over the passivation layer, wherein the photo resist is filled into the opening;

patterning the photo resist so that the opening in the passivation layer is exposed through the photo resist;

after the step of patterning the photo resist, forming a copper pillar having a portion in the opening, wherein the copper pillar is electrically connected to, and over, the RDL, and wherein the step of forming the copper pillar comprises electro plating;

after the step of forming the copper pillar, electro plating a barrier layer on the copper pillar;

plating a solder layer on the barrier layer; and removing the photo resist after the step of plating the solder layer.

9. The method of claim 8 further comprising:

before the step of forming the copper pillar, forming a photo resist over the passivation layer, wherein the photo resist is filled into the opening;

before the step of forming the copper pillar, patterning the photo resist so that the opening in the passivation layer is exposed through the photo resist:

after the step of forming the copper pillar, removing the photo resist; and after the step of removing the photo resist, forming a metal finish on a top surface and sidewalls of the copper pillar.

10. The method of claim 8, wherein the copper pillar has a height greater than about 15 μm.

11. The method of claim 8, wherein the RDL comprises copper.

* * * * *